United States Patent
Yao et al.

(10) Patent No.: US 12,453,255 B2
(45) Date of Patent: Oct. 21, 2025

(54) DISPLAY SUBSTRATE AND MANUFACTURING METHOD THEREFOR, DISPLAY PANEL, AND DISPLAY DEVICE

(71) Applicant: BOE Technology Group Co., Ltd., Beijing (CN)

(72) Inventors: Qi Yao, Beijing (CN); Jaiil Ryu, Beijing (CN); Yingwei Liu, Beijing (CN); Muxin Di, Beijing (CN); Renquan Gu, Beijing (CN); Zhiwei Liang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 793 days.

(21) Appl. No.: 17/264,925

(22) PCT Filed: Jun. 17, 2020

(86) PCT No.: PCT/CN2020/096616
§ 371 (c)(1),
(2) Date: Feb. 1, 2021

(87) PCT Pub. No.: WO2020/253734
PCT Pub. Date: Dec. 24, 2020

(65) Prior Publication Data
US 2021/0327995 A1 Oct. 21, 2021

(30) Foreign Application Priority Data
Jun. 18, 2019 (CN) .......................... 201910526074.1

(51) Int. Cl.
*H10K 59/131* (2023.01)
*H10K 59/12* (2023.01)
(Continued)

(52) U.S. Cl.
CPC .......... *H10K 59/131* (2023.02); *H10K 71/00* (2023.02); *H10K 77/111* (2023.02); *H10K 59/1201* (2023.02); *H10K 2102/311* (2023.02)

(58) Field of Classification Search
CPC .... H10K 59/131; H10K 71/00; H10K 77/111; H10K 59/1201; H10K 2102/311; Y02P 70/50; Y02E 10/549
See application file for complete search history.

(56) References Cited

U.S. PATENT DOCUMENTS

| 11,239,257 | B2 * | 2/2022 | Liang | ............ H10K 59/131 |
| 2012/0138940 | A1 * | 6/2012 | Sato | ............ H01L 27/1218 |
| | | | | 257/66 |

(Continued)

FOREIGN PATENT DOCUMENTS

| CN | 106298837 A | 1/2017 |
| CN | 107256870 A | 10/2017 |

(Continued)

OTHER PUBLICATIONS

Chinese Office Action for corresponding application 201910526074.1 issued on Nov. 27, 2020.

*Primary Examiner* — Shaun M Campbell
(74) *Attorney, Agent, or Firm* — ArentFox Schiff LLP; Michael Fainberg

(57) ABSTRACT

A display substrate and a manufacturing method therefor, a display panel, and a display device. The display substrate comprises a base substrate; a drive circuit arranged in an array in a display area on a first surface of the base substrate; a bonding electrode located on a second surface of the base substrate and arranged in the display area; a signal line located in the display area, one end of the signal line is electrically connected to the bonding electrode, and the other end is electrically connected to the drive circuit; and a conductive structure at least filled into a through hole at least (Continued)

passing through the base substrate, the conductive structure is configured to connect the signal line, the drive circuit and the bonding electrode.

16 Claims, 6 Drawing Sheets

(51) Int. Cl.
*H10K 71/00* (2023.01)
*H10K 77/10* (2023.01)
*H10K 102/00* (2023.01)

(56) References Cited

U.S. PATENT DOCUMENTS

| | | | | |
|---|---|---|---|---|
| 2013/0107476 | A1* | 5/2013 | Wright | H10K 59/80 |
| | | | | 361/767 |
| 2016/0351650 | A1* | 12/2016 | Chang | H01L 23/481 |
| 2017/0317157 | A1* | 11/2017 | Li | H10K 50/8423 |
| 2019/0035870 | A1* | 1/2019 | Park | H10K 77/00 |
| 2019/0067332 | A1* | 2/2019 | Liu | H01L 27/124 |
| 2020/0168682 | A1* | 5/2020 | Kishimoto | H01L 27/124 |
| 2021/0118968 | A1* | 4/2021 | Lee | H10K 59/123 |
| 2021/0202530 | A1* | 7/2021 | Yao | H01L 27/124 |
| 2021/0210522 | A1 | 7/2021 | Liu et al. | |
| 2021/0288118 | A1* | 9/2021 | Lee | H10K 59/131 |
| 2021/0313405 | A1* | 10/2021 | Xu | H10K 59/353 |

FOREIGN PATENT DOCUMENTS

| | | | | | |
|---|---|---|---|---|---|
| CN | 109585462 | A | * | 4/2019 | H01L 25/0655 |
| CN | 111244129 | A | | 6/2020 | |
| WO | WO-2018223696 | A1 | * | 12/2018 | H01L 27/1218 |

\* cited by examiner

DISPLAY SUBSTRATE AND MANUFACTURING METHOD THEREFOR, DISPLAY PANEL, AND DISPLAY DEVICE

CROSS REFERENCE TO RELATED APPLICATIONS

The present disclosure is a National Stage of International Application No. PCT/CN2020/096616, filed Jun. 17, 2020, which claims priority to the Chinese Patent Application No. 201910526074.1, filed to the Patent Office of the People's Republic of China on Jun. 18, 2019 and entitled "DISPLAY SUBSTRATE AND MANUFACTURING METHOD THEREFOR, DISPLAY PANEL, AND DISPLAY DEVICE", the entire contents of which are incorporated herein by reference.

FIELD

The present disclosure relates to the technical field of display, in particular to a display substrate and a manufacturing method therefor, a display panel, and a display device.

BACKGROUND

A full-screen technology is gradually becoming a mainstream technology of a handheld device such as a mobile phone. At present, left and right bezels are narrowed by adopting a GOA (Gate Driver On Array) technology, and a lower bezel is narrowed by adopting a COF (Chip On Film) technology.

SUMMARY

An embodiment of the present disclosure provides a display substrate provided with a display area and a bezel area surrounding the display area, wherein the display substrate includes:
  a base substrate, including a first surface and a second surface arranged oppositely;
  a drive circuit, located on the first surface of the base substrate and arranged in an array in the display area;
  a bonding electrode, located on the second surface of the base substrate and arranged in the display area;
  a signal line, located in the display area, wherein one end of the signal line is electrically connected to the bonding electrode, and the other end of the signal line is electrically connected to the drive circuit; and
  a conductive structure, filled into a through hole at least passing through the base substrate, wherein the conductive structure is configured to turn on the signal line, the drive circuit and the bonding electrode.

Optionally, the above-mentioned display substrate provided by embodiments of the present disclosure further includes a connecting electrode located on the first surface of the base substrate and electrically connected to the drive circuit;
  the signal line includes a first-kind signal line, and the first-kind signal line is on the second surface of the base substrate and is electrically connected to the bonding electrode; and
  the through hole is in an overlapped area of the first-kind signal line and the connecting electrode, and the first-kind signal line is electrically connected to the connecting electrode by the conductive structure.

Optionally, in the above-mentioned display substrate provided by embodiments of the present disclosure, the signal line includes a second-kind signal line, and the second-kind signal line is on the first surface of the base substrate and is electrically connected to the drive circuit; and
  the through hole is in an overlapped area of the second-kind signal line and the bonding electrode, and the second-kind signal line is electrically connected to the bonding electrode by the conductive structure.

Optionally, in the above-mentioned display substrate provided by embodiments of the present disclosure, the first-kind signal line is a data line, the bonding electrode is a data line bonding electrode, and the connecting electrode is electrically connected to a source of a thin film transistor in the drive circuit; and/or,
  the first-kind signal line is a scanning line, the bonding electrode is a scanning line bonding electrode, and the connecting electrode is electrically connected to a gate of the thin film transistor in the drive circuit.

Optionally, in the above-mentioned display substrate provided by embodiments of the present disclosure, the second-kind signal line is a data line, the bonding electrode is a data line bonding electrode, and the data line is electrically connected to a source of a thin film transistor in the drive circuit; and/or,
  the second-kind signal line is a scanning line, the bonding electrode is a scanning line bonding electrode, and the scanning line is electrically connected to a gate of the thin film transistor in the drive circuit.

Optionally, the above-mentioned display substrate provided by embodiments of the present disclosure further includes a scanning drive circuit located on the second surface of the base substrate and electrically connected to the scanning line bonding electrode.

Optionally, the above-mentioned display substrate provided by embodiments of the present disclosure further includes an electroluminescent device located on the first surface of the base substrate and electrically connected to the drive circuit.

Optionally, in the above-mentioned display substrate provided by embodiments of the present disclosure, the base substrate is a flexible base substrate.

In another aspect, an embodiment of the present disclosure further provides a method for manufacturing the above-mentioned display substrate, including:
  forming a base substrate;
  forming a drive circuit arranged in an array in a display area on a first surface of the base substrate;
  inverting the base substrate, and forming a through hole at least passing through the base substrate in a second surface of the base substrate;
  forming a conductive structure in the through hole;
  forming a bonding electrode on the second surface of the base substrate; and
  forming a signal line in the display area, wherein one end of the signal line is electrically connected to the bonding electrode, the other end of the signal line is electrically connected to the drive circuit, and the conductive structure is configured to connect the signal line, the drive circuit and the bonding electrode.

Optionally, in the above-mentioned manufacturing method provided by embodiments of the present disclosure, the forming a through hole at least passing through the base substrate in the second surface of the base substrate includes:
  forming a patterned hard mask layer on the second surface of the base substrate;

dry etching the base substrate by adopting the patterned hard mask layer as a shield to form the through hole; and removing the hard mask layer.

Optionally, in the above-mentioned manufacturing method provided by embodiments of the present disclosure, the forming a conductive structure in the through hole includes:

forming a seed layer on a bottom and wall surface of the through hole; and filling the through hole with metal by using an electroplating process to form the conductive structure.

Optionally, in the above-mentioned manufacturing method provided by embodiments of the present disclosure, the seed layer is made of a metal element of titanium, molybdenum, tantalum, aluminum, copper or silver, or the seed layer is made of molybdenum alloy, copper alloy or aluminum alloy.

Optionally, in the above-mentioned manufacturing method provided by embodiments of the present disclosure, the forming a signal line in the display area specifically includes:

forming a first-kind signal line electrically connected to the bonding electrode in the display area on the second surface of the base substrate after forming a conductive structure in the through hole.

Optionally, in the above-mentioned manufacturing method provided by embodiments of the present disclosure, forming a first-kind signal line electrically connected to the bonding electrode in the display area on the second surface of the base substrate in response to that the first-kind signal line includes a data line and a scanning line specifically includes:

forming a data line in the display area on the second surface of the base substrate after forming a conductive structure in the through hole corresponding to the data line;

forming an insulating layer on a film layer on which the data line is located; and forming a through hole corresponding to the scanning line and passing through the base substrate and the insulating layer in the second surface of the base substrate, and forming the scanning line in the display area on the second surface of the base substrate after forming a conductive structure in the through hole.

Optionally, in the above-mentioned manufacturing method provided by embodiments of the present disclosure, the forming a signal line in the display area includes:

forming a second-kind signal line electrically connected to the drive circuit in the display area on the first surface of the base substrate.

In further aspect, an embodiment of the present disclosure further provides another method for manufacturing the above-mentioned display substrate, including:

forming a sacrificial buffer layer on a rigid substrate;

forming a bonding electrode at a side, facing away from the rigid substrate, of the sacrificial buffer layer;

forming a base substrate at a side, facing away from the sacrificial buffer layer, of the bonding electrode;

forming a through hole passing through the base substrate, and forming a conductive structure in the through hole;

forming a drive circuit arranged in an array on the base substrate;

forming a signal line in the display area, wherein one end of the signal line is electrically connected to the bonding electrode, the other end of the signal line is electrically connected to the drive circuit, and the conductive structure is configured to connect the signal line, the drive circuit and the bonding electrode; and removing the rigid substrate and the sacrificial buffer layer.

In yet further aspect, an embodiment of the present disclosure further provides a display panel, including the above-mentioned display substrate and a drive circuit connected to at least part of a bonding electrode.

In further another aspect, an embodiment of the present disclosure provides a display device, including the above-mentioned display panel.

DETAILED DESCRIPTION OF THE EMBODIMENTS

At present, a display substrate such as an OLED (Organic Light Emitting Display Panel) is provided with a scanning line and a data line, and a GOA and an IC (Integrated Circuit) are electrically connected to the scanning line and the data line in a bezel area respectively so as to output a control signal to the scanning line and the data line. The scanning line and the data line require leading wires to be arranged on the edge of the display substrate so as to be connected with the GOA and the IC in the bezel area, in this way, a bezel with a certain width is required to be reserved on the edge of the display substrate, so that a display device cannot realize a narrow bezel or zero bezel design, and a full screen may not be favorably achieved.

Technical solutions in embodiments of the present disclosure will be clearly and completely described below in conjunction with the accompanying drawings in the embodiments of the present disclosure. Obviously, the described embodiments are merely a part of the embodiments of the present disclosure, not all the embodiments. Based on the embodiments in the present disclosure, all other embodiments obtained by those of ordinary skill in the art without creative work shall fall within the protection scope of the present disclosure.

Figure 1:
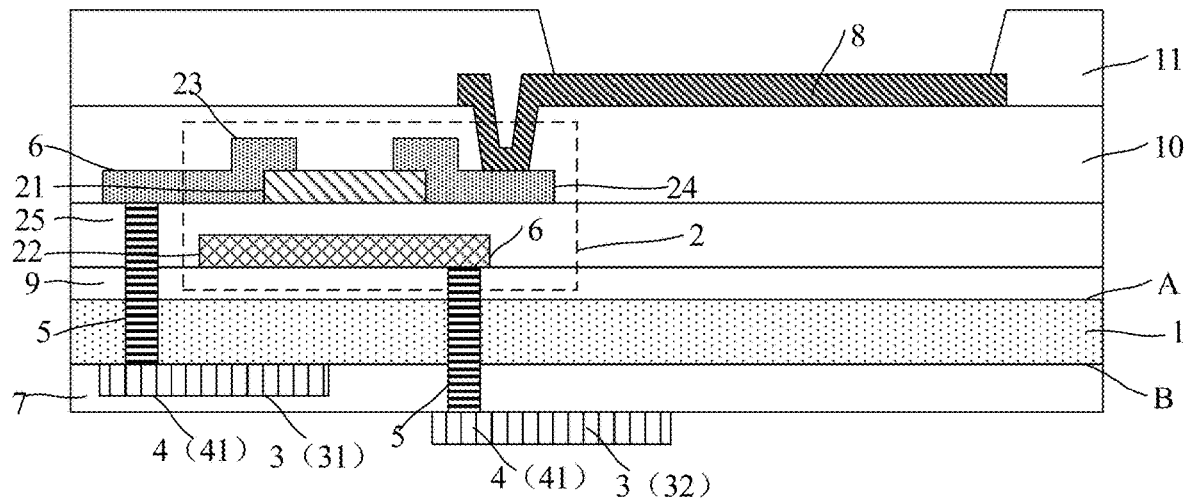
FIG. 1 is a schematic diagram showing a structure of a display substrate provided by an embodiment of the present disclosure.
Figure 2:
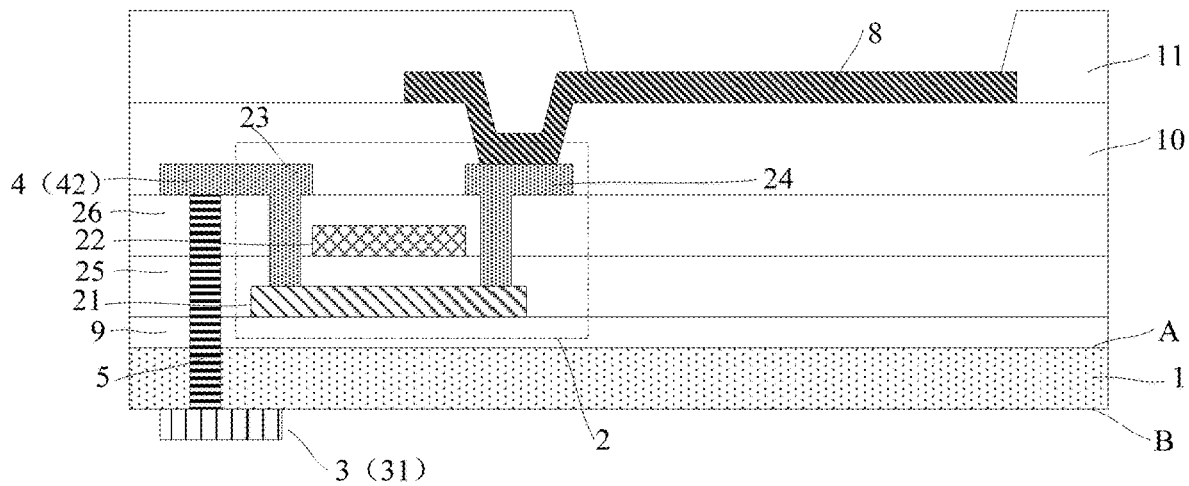
FIG. 2 is a schematic diagram showing a structure of another display substrate provided by an embodiment of the present disclosure.

Referring to FIG. 1 and FIG. 2, the present disclosure provides a display substrate provided with a display area and a bezel area surrounding the display area. FIG. 1 and FIG. 2 only show partial structures in the display area. The display substrate includes:

a base substrate 1, including a first surface A and a second surface B arranged oppositely;

a drive circuit 2, located on the first surface A of the base substrate 1 and arranged in an array in the display area, wherein the drive circuit 2 generally includes one or more thin film transistors, and one thin film transistor as an example is described in FIG. 1 and FIG. 2;

a bonding electrode 3, located on the second surface B of the base substrate 1 and arranged in the display area;

a signal line 4, located in the display area, wherein one end of the signal line is electrically connected to the bonding electrode 3, and the other end is electrically connected to the drive circuit 2; and a conductive structure 5, filled into a through hole at least passing through the base substrate 1, wherein the conductive structure 5 is configured to connect the signal line 4, the drive circuit 2 and the bonding electrode 3.

In the above-mentioned display substrate provided by embodiments of the present disclosure, since the bonding electrode 3 is arranged at the side, facing away from the drive circuit 2, of the base substrate 1, the bonding electrode 3 can be arranged in the display area without affecting the normal display of the obverse side (that is, the first surface A) of the display substrate. Driving components such as an IC or a GOA may be electrically connected to the bonding electrode 3 at the side, facing away from the drive circuit 2, of the base substrate 1 and may be arranged in the display area, so that it is not necessary to reserve a bezel with a certain width for the drive circuit on the edge of the display substrate, and furthermore, a narrow bezel or zero bezel design is realized.

Optionally, in the above-mentioned display substrate provided by embodiments of the present disclosure, the signal line 4 may be located on the first surface A or the second surface B of the base substrate 1. Moreover, the signal line 4 may include any signal lines such as data lines and scanning lines required to be connected with the drive circuit or the driving components such as the GOA, and a connection relationship between the signal line 4 and the corresponding component in the drive circuit 2 is designed according to different signals required to be transmitted by the signal line 4. Detailed introduction will be described below with specific embodiments.

As shown in FIG. 1, when the signal line 4 is located on the second surface B of the base substrate 1 and is electrically connected to the bonding electrode 3, the signal line 4 and the bonding electrode 3 correspondingly connected to the signal line 4 may be patterned in the same film layer or different film layers, the limitations thereof are omitted herein. Moreover, this kind of signal line 4 may be referred to as a first-kind signal line 41. In addition, since the bonding electrodes 3 are generally designed to be relatively centralized to facilitate connecting of pins, required to be bound, of the drive circuit, a length of leading wire may be arranged between the first-kind signal line 41 and the bonding electrode 3 connected to the first-kind signal line 41 to facilitate connecting of the first-kind signal line 41 to the bonding electrode 3, and the leading wires connected to all first-kind signal lines 41 may form a fan-out area with a shape similar to a sector.

In order to ensure that the corresponding component in the drive circuit 2 can be electrically connected to the first-kind signal line 41 by the conductive structure 5, a connecting electrode 6 electrically connected to the drive circuit 2 may also be arranged on the first surface A of the base substrate 1. The connecting electrode 6 and the first-kind signal line 41 have an overlapped area in which a through hole passing through the base substrate 1 is formed, so that the first-kind signal line 41 can be electrically connected to the connecting electrode 6 by the conductive structure 5.

Moreover, in order to ensure that all the drive circuits 2 arranged on the first surface A of the base substrate 1 can be electrically connected to the first-kind signal lines 41 by the conductive structures 5, the through holes and the connecting electrodes 6 in one-to-one correspondence to all the drive circuits 2 in number are required to be arranged. Optionally, the connecting electrodes 6 may be patterned in the same film layer together with the corresponding components required to be connected in the drive circuits 2.

For example, when the first-kind signal line 41 is a data line, that is, the data line is arranged on the second surface B of the base substrate, the bonding electrode 3 may be regarded as a data line bonding electrode 31 used to be bound to a driving chip (Driver IC), the connecting electrode 6 is generally electrically connected to a source 23 of a certain thin film transistor in the drive circuit 2. Correspondingly, each drive circuit 2 is required to be internally provided with a connecting electrode 6 electrically connected to the source 23 and the conductive structure 5 connected to the connecting electrode 6. Optionally, an extending part of the source 23 may be used as the connecting electrode 6, or a certain film layer (such as a gate metal layer) between a film layer on which the source 23 is located and the base substrate 1 may be provided with the connecting electrode 6, the limitations thereof are omitted herein. FIG. 1 is described with an example in which the connecting electrode 6 and the source 23 are patterned in the same film layer.

For another example, when the first-kind signal line 41 is a scanning line, that is, the scanning line is arranged on the second surface B of the base substrate, the bonding electrode 3 may be regarded as a scanning line bonding electrode 32 used to be connected with the GOA, the connecting electrode 6 is generally electrically connected to a gate 22 of a certain thin film transistor in the drive circuit 2. Correspondingly, each drive circuit 2 is required to be internally provided with a connecting electrode 6 electrically connected to the gate 22 and a conductive structure 5 connected to the connecting electrode 6. Optionally, an extending part of the gate 22 may be used as the connecting electrode 6, or a certain film layer (such as a light shielding layer) between a film layer on which the gate 22 is located and the base substrate 1 may be provided with the connecting electrode 6, the limitations thereof are omitted herein. FIG. 1 is described with an example in which the connecting electrode 6 and the gate 22 are patterned in the same film layer.

Moreover, in the above-mentioned display substrate provided by the embodiment of the present disclosure, the data line and the scanning line may simultaneously adopt the design method of the first-kind signal lines 41. Since extension directions of the data line and the scanning line are intercrossed, it is required to arrange the data line and the scanning line on different film layers on the second surface B of the base substrate 1, for example, as shown in FIG. 1, an insulating layer 7 is arranged between the first-kind signal line 41 serving as the data line and the first-kind signal line 41 serving as the scanning line.

As shown in FIG. 2, when the signal line 4 is located on the first surface A of the base substrate 1 and is electrically connected to the drive circuit 2, the signal line 4 and components, correspondingly connected with the signal line 4, in the drive circuit 2 may be patterned in the same film layer or different film layers, the limitations thereof are omitted herein. Moreover, the signal line 4 may be referred to as a second-kind signal line 42. In addition, since the bonding electrodes 3 are generally designed to be relatively centralized to facilitate connecting of pins, required to be bound, of the drive circuit, a length of leading wire may be arranged between the second-kind signal line 42 and the bonding electrode 3 connected to the second-kind signal line 42 to facilitate connecting of the second-kind signal line 42 to the bonding electrode 3, and the leading wires connected to all second-kind signal lines 42 may form a fan-out area with a shape similar to a sector. The leading wire may be patterned in the same film layer together with the second-kind signal line 42, or the leading wire may be patterned in the same film layer together with the bonding electrode 3, the limitations thereof are omitted herein.

Optionally, corresponding components in a row or column of drive circuits 2 may be electrically connected to the same second-kind signal line 42, then, a through hole passing through the base substrate 1 is formed in an overlapped area of the second-kind signal line 42 and the bonding electrode 3, and thus, the second-kind signal line 42 may be electrically connected to the bonding electrode 3 by a conductive structure 5. For example, when the second-kind signal line 42 is a data line, the bonding electrode 3 is a data line bonding electrode 31, and one data line is electrically connected to sources 23 of thin film transistors in a column of drive circuits 2. For another example, when the second-kind signal line 42 is a scanning line, the bonding electrode 3 is a scanning line bonding electrode 32, and one scanning line is electrically connected to gates 22 of thin film transistors in a row of drive circuits 2. Through holes in one-to-one correspondence to the second-kind signal line 42 may be formed in the base substrate 1, of course, it is not excluded that a plurality of second-kind signal lines 42 are simultaneously connected to one bonding electrode 3 by one through hole and one second-kind signal line 42 is simultaneously connected to one bonding electrode 3 by a plurality of through holes.

Optionally, in the above-mentioned display substrate provided by embodiments of the present disclosure, the thin film transistor in a drive circuit 2 may adopt a bottom-gate-type thin film transistor as shown in FIG. 2 or a top-gate-type thin film transistor as shown in FIG. 1. The top-gate-type thin film transistor, as shown in FIG. 1, generally includes a gate 22, a gate insulating layer 25, an active layer 21, a source 23 and a drain 24 located on the base substrate 1. The bottom-gate-type thin film transistor, as shown in FIG. 2, generally includes an active layer 21, a gate insulating layer 25, a gate 22, an interlayer insulating layer 26, a source 23 and a drain 24 located on the base substrate 1. Generally, sources 23 of thin film transistors in a column of drive circuits 2 are used for receiving a data signal provided by the same data line, gates 22 of thin film transistors in a row of drive circuits 2 are used for receiving a scanning signal provided by the same scanning line, and drains 24 of thin film transistors are generally electrically connected to an anode 8 (or a pixel electrode). A buffer layer 9 may be arranged between the drive circuits 2 and the base substrate 1, a planarization layer 10 may be arranged between the drive circuits 2 and the anode 8, and the anode 8 may be provided with a pixel defining layer 11, so that an electroluminescent device electrically connected to the drive circuits 2 is arranged on the first surface A of the base substrate 1, optionally, an electroluminescent display panel is electrically connected to the anode 8. Or, a micro LED may also be bound to the anode 8.

Optionally, in the above-mentioned display substrate provided by embodiments of the present disclosure, when the second surface B of the base substrate 1 is provided with a scanning line bonding electrode 32, a scanning drive circuit, that is, a GOA circuit, electrically connected to the scanning line bonding electrode 32 may be directly manufactured on the second surface B of the base substrate 1.

Optionally, in the above-mentioned display substrate provided by embodiments of the present disclosure, the base substrate 1 may be a flexible base substrate.

Figure 3:
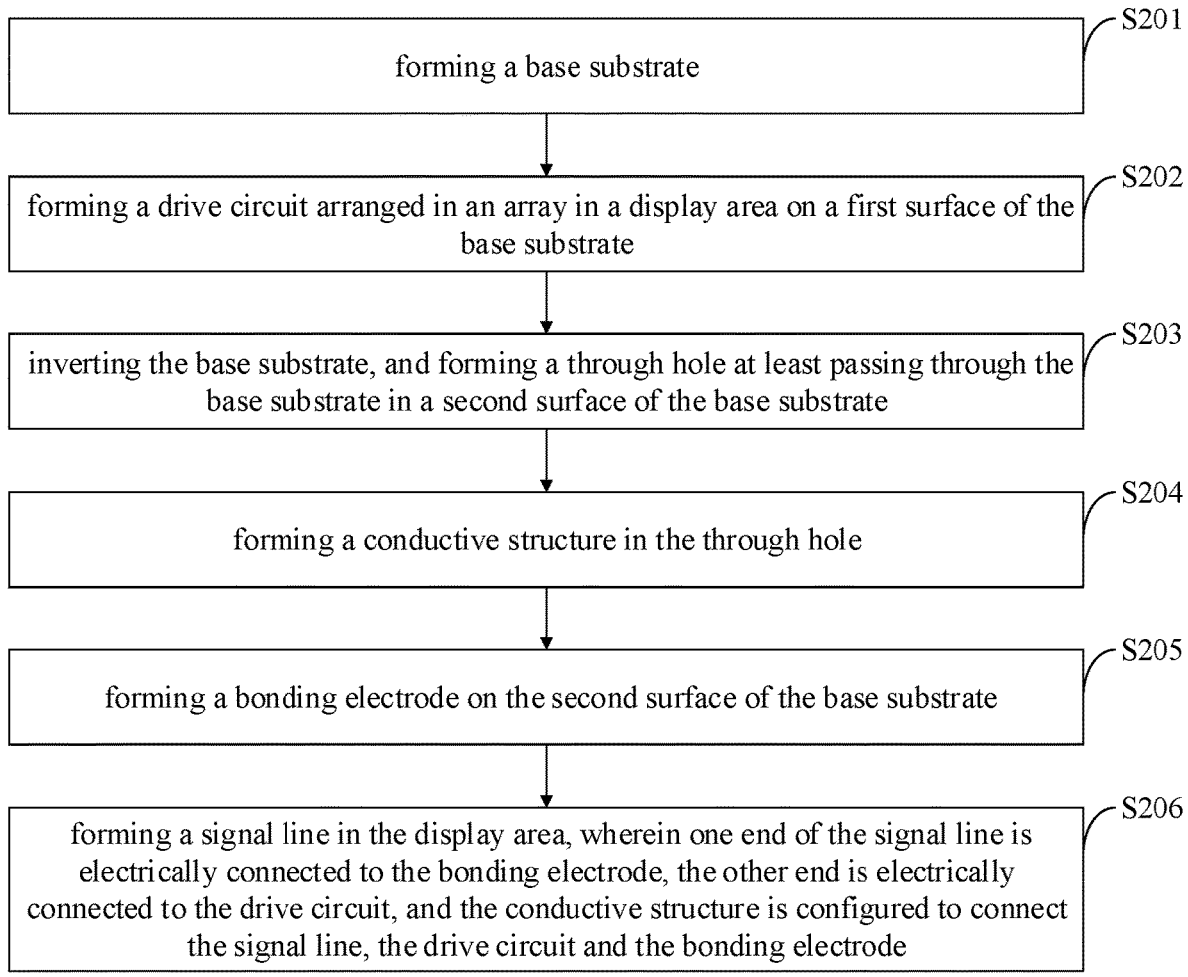
FIG. 3 is a flow diagram showing a method for manufacturing the display substrate, provided by an embodiment of the present disclosure.

Based on the same inventive concept, the present disclosure further provides a method for manufacturing the above-mentioned display substrate. As shown in FIG. 3, the manufacturing method includes the steps described as follows:

S201, forming a base substrate;
S202, forming a drive circuit arranged in an array in a display area on a first surface of the base substrate;
S203, inverting the base substrate, and forming a through hole at least passing through the base substrate in a second surface of the base substrate;
S204, forming a conductive structure in the through hole;
S205, forming a bonding electrode on the second surface of the base substrate; and
S206, forming a signal line in the display area, wherein one end of the signal line is electrically connected to the bonding electrode, the other end is electrically connected to the drive circuit, and the conductive structure is configured to connect the signal line, the drive circuit and the bonding electrode.

Optionally, in the above-mentioned manufacturing method provided by embodiments of the present disclosure, after the drive circuit on the first surface of the base substrate is manufactured, the through hole is formed in the second surface of the base substrate, the through hole is filled with a conductive structure, and then, the bonding electrode is manufactured on the second surface of the base substrate, and the bonding electrode may be arranged in the display area without affecting the normal display of the obverse side (that is, the first surface) of the display substrate. Driving components such as an IC or a GOA may be electrically connected to the bonding electrode on the second surface of the base substrate and may be arranged in the display area, so that it is not necessary to reserve a bezel with a certain width for the drive circuits on the edge of the display substrate, and furthermore, a narrow bezel or zero bezel design is realized.

Optionally, in the above-mentioned manufacturing method provided by embodiments of the present disclosure, a process step in which above-mentioned step S206 of forming the signal line in the display area is performed may be determined according to the type of the selected signal line. For example, when a first-kind signal line is selected, the first-kind signal line electrically connected to the bonding electrode may be formed in the display area on the second surface of the base substrate after step S204 of forming the conductive structure in the through hole, and step 206 may be performed while step 205 of forming the bonding electrode on the second surface of the base substrate is performed. For another example, when a second-kind signal line is selected, the second-kind signal line electrically connected to the drive circuit may be formed in the display area on the first surface of the base substrate before step S203 of inverting the base substrate, and step 206 may be performed while step 202 of forming the drive circuit arranged in an array in the display area on the first surface of the base substrate. For further example, when the signal line partially adopts the first-kind signal line and partially adopts the second-kind signal line, for example, when the first-kind signal line is selected as the data line and the second-kind signal line is selected as the scanning line, a second-kind scanning line can be manufactured while step S202 is performed, and a first-kind scanning line can be manufactured while step S205 is performed.

Moreover, when the first-kind signal line simultaneously includes the data line and the scanning line, extension directions of the data line and the scanning line are inter-crossed, and the data line and the scanning line cannot be manufactured on the same film layer, so that the first-kind signal line electrically connected to the bonding electrode is formed in the display area on the second surface of the base substrate, and a through hole corresponding to the data line and a through hole corresponding to the scanning line may be respectively formed, including:

firstly, the data line is formed in the display area on the second surface of the base substrate after the conductive structure is formed in the through hole corresponding to the data line;

then, an insulating layer is formed on a film layer on which the data line is located; and next, the through hole corresponding to the scanning line and passing through the base substrate and the insulating layer is formed in the second surface of the base substrate, and the scanning line is formed in the display area on the second surface of the base substrate after the conductive structure is formed in the through hole.

Figure 4A:
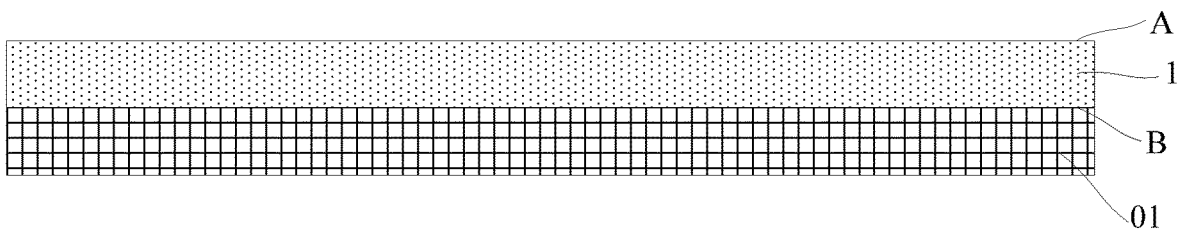
FIG. 4A is a schematic diagram showing a manufacturing process of the display substrate, provided by an embodiment of the present disclosure.

Optionally, in the method for manufacturing the above-mentioned display substrate, provided by embodiments of the present disclosure, step S201 may include: as shown in FIG. 4A, a base substrate 1 is formed on a first rigid substrate 01.

Figure 4B:
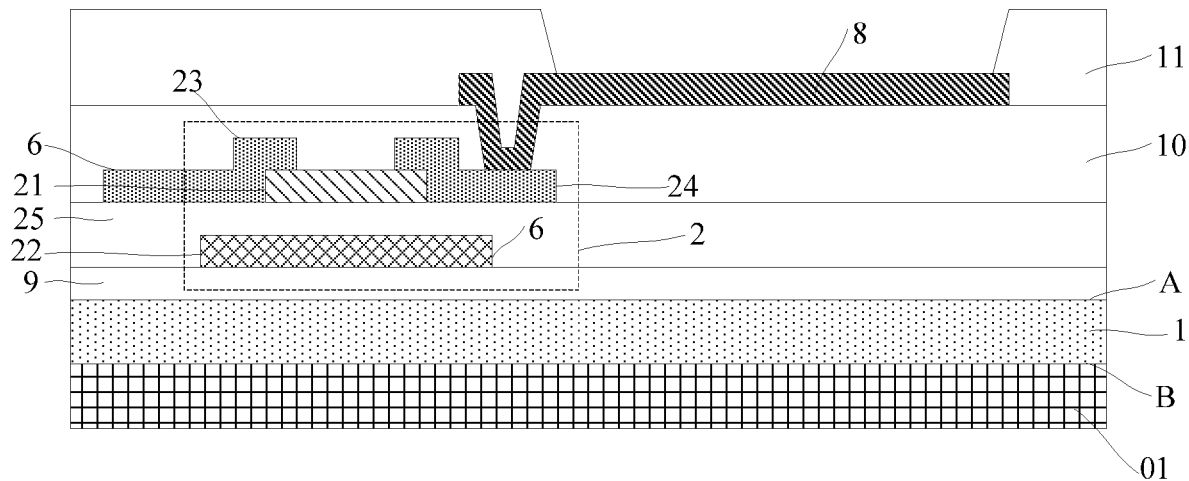
FIG. 4B is a schematic diagram showing a manufacturing process of the display substrate, provided by an embodiment of the present disclosure.

With a structure as shown in FIG. 1 as an example, as shown in FIG. 4B, a drive circuit 2 arranged in an array and a connecting electrode 6 are formed in a display area on a first surface A of the base substrate 1 on the basis that the first rigid substrate 01 is used as a carrier. Optionally, a thin film transistor of the drive circuit 2 may include a gate 22, a gate insulating layer 25, an active layer 21, an interlayer insulating layer 26, a source 23 ad a drain 24 which are sequentially stacked. A buffer layer 9 may also be arranged between the thin film transistor and the base substrate 1. A planarization layer 10, an anode 8, a pixel defining layer 11, an electroluminescent device and the like may also be manufactured on the thin film transistor, and the electroluminescent device may also be packaged.

Figure 4C:
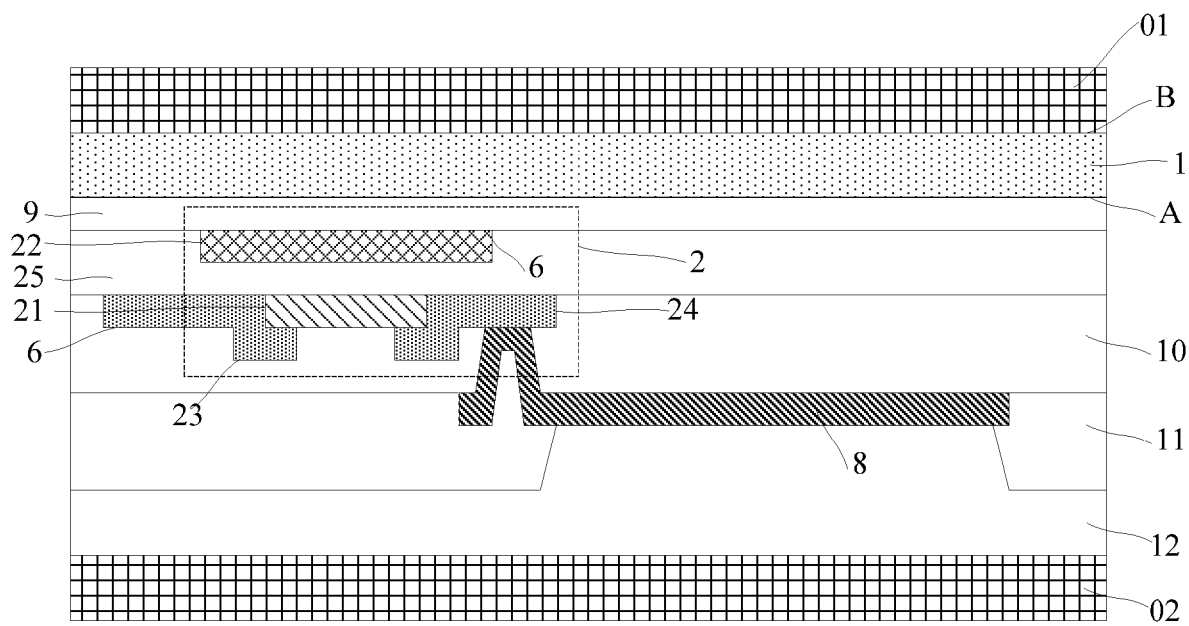
FIG. 4C is a schematic diagrams showing a manufacturing process of the display substrate, provided by an embodiment of the present disclosure.

Then, as shown in FIG. 4C, the base substrate 1 is inverted, and a second rigid substrate 02 is bonded from the first surface A of the base substrate 1 by using a bonding material 12, wherein a vacuum bonding device is adopted for bonding, and the bonding material 12 may be a thermally curable adhesive.

Figure 4D:
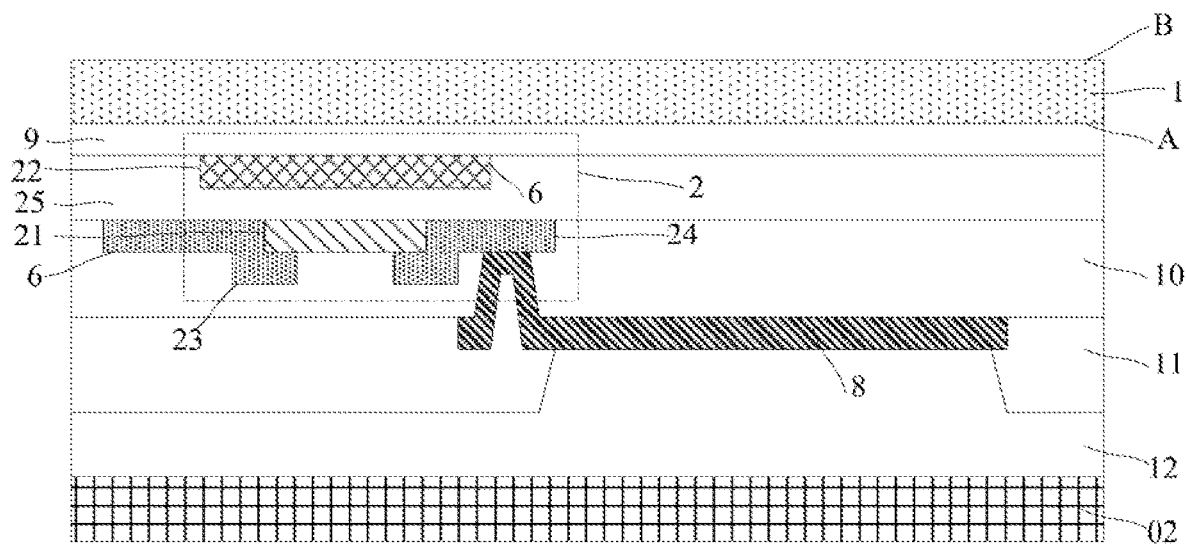
FIG. 4D is a schematic diagram showing a manufacturing process of the display substrate, provided by an embodiment of the present disclosure.
Figure 4E:
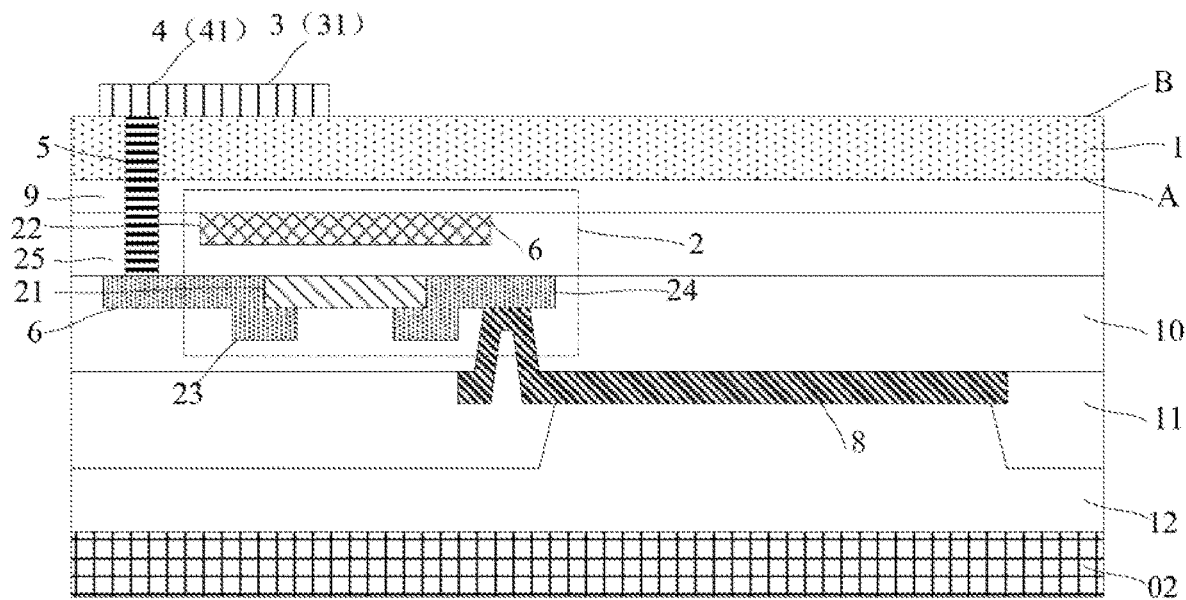
FIG. 4E is a schematic diagram showing a manufacturing process of the display substrate, provided by an embodiment of the present disclosure.

Next, as shown in FIG. 4D, the first rigid substrate 01 is removed. As shown in FIG. 4E, a through hole passing through the base substrate 1 is formed in a second surface B of the base substrate 1, a conductive structure 5 is formed in the through hole, and the through hole extends to a connecting electrode 6 connected to the source 23, optionally, the through hole passes through the base substrate 1, the buffer layer 9 and the gate insulating layer 25. A second-kind signal line 42 serving as the data line and a data line bonding electrode 31 connected to the second-kind signal line 42 are formed on the second surface B of the base substrate 1.

Figure 4F:
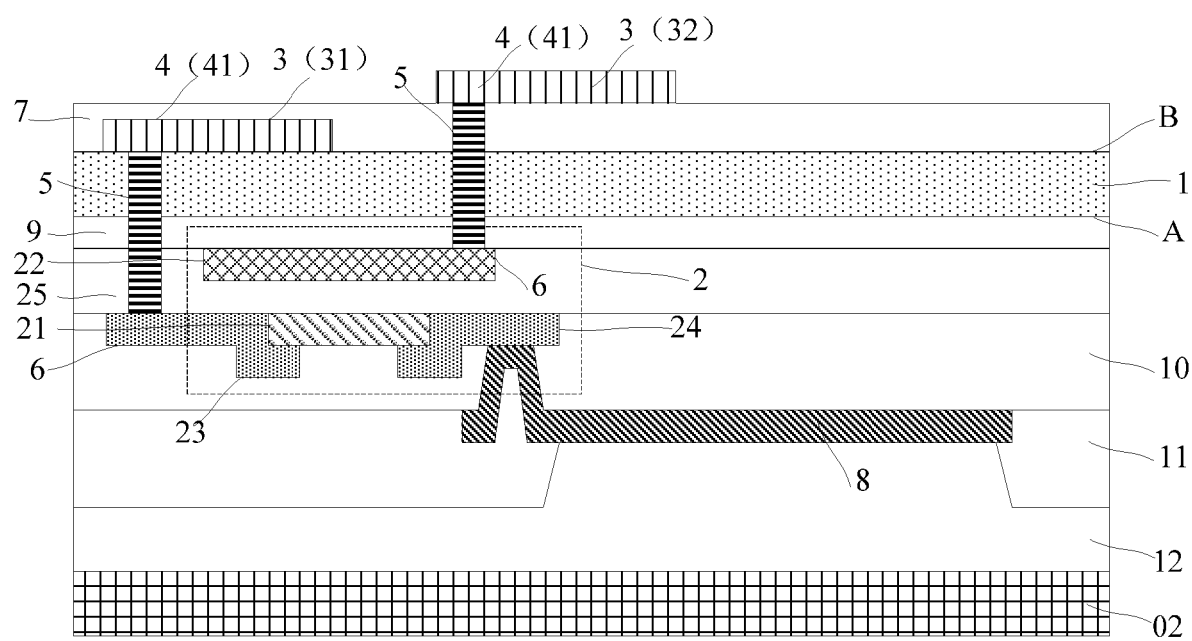
FIG. 4F is a schematic diagram showing a manufacturing process of the display substrate, provided by an embodiment of the present disclosure.

Then, an insulating layer 7 is formed on the second surface B of the base substrate 1. As shown in FIG. 4F, a through hole passing through the base substrate 1 is formed in a second surface B of the base substrate 1, a conductive structure 5 is formed in the through hole, and the through hole extends to a connecting electrode 6 connected to the gate 22, optionally, the through hole passes through the base substrate 1 and the buffer layer 9. A second-kind signal line 42 serving as the scanning line and a scanning line bonding electrode 32 connected to the second-kind signal line 42 and a GOA are formed on the second surface B of the base substrate 1.

Finally, the bonding material 12 and the second rigid substrate 02 are removed. Since the bonding material 12 is the thermally curable adhesive of which the viscosity is reduced at 200-300 DEG C., the display substrate can be separated from the second rigid substrate 02. Finally, the drive circuits (IC devices) are bound to the data line bonding electrode 31, and a back film is attached to the second surface B.

Optionally, in the method for manufacturing the above-mentioned display substrate, provided by embodiments of the present disclosure, above-mentioned step S203 of forming the through hole at least passing through the base substrate in the second surface of the base substrate may include the steps:

firstly, a patterned hard mask layer is formed on the second surface of the base substrate;

then, the base substrate is dry etched by adopting the patterned hard mask layer as a shield to form the through hole; and finally, the hard mask layer is removed.

Optionally, in the method for manufacturing the above-mentioned display substrate, provided by embodiments of the present disclosure, above-mentioned step S204 of forming the conductive structure in the through hole may include the steps:

firstly, a seed layer is formed on the bottom and wall surface of the through hole; and then, the through hole is filled with metal by using an electroplating process to form the conductive structure.

In the above-mentioned manufacturing method, the seed layer firstly formed on the bottom and wall surface of the through hole can lower the subsequent electroplating filling difficulty and avoid the situation that the conductive structure is fractured to affect signal transmission.

Optionally, the seed layer is made of a single metal such as titanium, molybdenum, tantalum, aluminum, copper and silver or molybdenum alloy, copper alloy or aluminum alloy.

Figure 5:
FIG. 5 is a flow diagram showing another method for manufacturing the display substrate, provided by an embodiment of the present disclosure.

Based on the same inventive concept, the present disclosure further provides another method for manufacturing the above-mentioned display substrate. As shown in FIG. 5, the manufacturing method includes the specific steps described as follows:

S401, forming a sacrificial buffer layer on a rigid substrate;

S402, forming a bonding electrode at the side, facing away from the rigid substrate, of the sacrificial buffer layer;

S403, forming a base substrate at the side, facing away from the sacrificial buffer layer, of the bonding electrode;

S404, forming a through hole passing through the base substrate, and forming a conductive structure in the through hole;

S405, forming a drive circuit arranged in an array on the base substrate;

S406, forming a signal line in the display area, wherein one end of the signal line is electrically connected to the bonding electrode, the other end is electrically connected to the drive circuit, and the conductive structure is configured to turn on the signal line, the drive circuit and the bonding electrode, optionally, fabricating the first-kind signal line while implementing S403, and fabricating the second-kind signal line while implementing S405; and S407, removing the rigid substrate and the sacrificial buffer layer.

Based on the same inventive concept, an embodiment of the present disclosure further provides a display panel including the above-mentioned display substrate and a drive circuit (ICs) connected to at least part of a bonding electrode (a data line bonding electrode), wherein the display panel may be an organic electroluminescence display panel or a micro LED display panel.

Based on the same inventive concept, an embodiment of the present disclosure further provides a display device including the above-mentioned display panel.

Obviously, those skilled in the art can make various alterations and variations on the embodiments of the present disclosure without departing from the spirit and scope of the present disclosure. In this way, if these alterations and variations of the present disclosure fall within the scopes of the claims and the equivalent technologies of the present disclosure, the present disclosure is also intended to include these alterations and variations.

What is claimed is:

1. A display substrate, being provided with a display area, wherein the display substrate comprises:
   a base substrate, comprising a first surface and a second surface arranged oppositely;
   a drive circuit, located on the first surface of the base substrate and arranged in an array in the display area;
   a bonding electrode, located on the second surface of the base substrate and arranged in the display area;
   a signal line, located in the display area, wherein one end of the signal line is electrically connected to the bonding electrode, and the other end of the signal line is electrically connected to the drive circuit; and
   a conductive structure, filled into a through hole at least passing through the base substrate, wherein the conductive structure is configured to connect the signal line, the drive circuit and the bonding electrode;
   wherein the display substrate further comprises:
   a connecting electrode located on the first surface of the base substrate and electrically connected to the drive circuit; wherein the connecting electrode comprises a first connecting electrode and a second connecting electrode;
   an insulating layer located on the second surface of the base substrate;
   the signal line comprises a first-kind signal line, the first-kind signal line is on the second surface of the base substrate and electrically connected to the bonding electrode; and the first-kind signal line is electrically connected to the connecting electrode by the conductive structure;
   wherein the first-kind signal line comprises a data line, the bonding electrode comprises a data line bonding electrode, and the first connecting electrode is electrically connected to a source of a thin film transistor in the drive circuit;
   wherein the first-kind signal line comprises a scanning line, the bonding electrode comprises a scanning line bonding electrode, and the second connecting electrode is electrically connected to a gate of the thin film transistor in the drive circuit;
   wherein the data line is located on one of top and bottom sides of the insulating layer, and the scanning line is located on other one of the top and the bottom sides of the insulating layer.

2. The display substrate according to claim 1, wherein the through hole is in an overlapped area of the first-kind signal line and the connecting electrode.

3. The display substrate according to claim 1, further comprises: a scanning drive circuit located on the second surface of the base substrate and electrically connected to the scanning line bonding electrode.

4. The display substrate according to claim 1, further comprises: an electroluminescent device located on the first surface of the base substrate and electrically connected to the drive circuit.

5. The display substrate according to claim 1, wherein the base substrate is a flexible base substrate.

6. A method for manufacturing a display substrate, comprising:
   forming a base substrate;
   forming a drive circuit arranged in an array in a display area on a first surface of the base substrate;
   inverting the base substrate, and forming a through hole at least passing through the base substrate in a second surface of the base substrate;
   forming a conductive structure in the through hole;
   forming a bonding electrode on the second surface of the base substrate; and
   forming a signal line in the display area, wherein one end of the signal line is electrically connected to the bonding electrode, the other end of the signal line is electrically connected to the drive circuit, and the conductive structure is configured to connect the signal line, the drive circuit and the bonding electrode;
   wherein the forming a signal line in the display area comprises:
   forming a first-kind signal line electrically connected to the bonding electrode in the display area on the second surface of the base substrate after forming a conductive structure in the through hole;
   wherein forming a first-kind signal line electrically connected to the bonding electrode in the display area on the second surface of the base substrate in response to that the first-kind signal line comprises a data line, comprises:
   forming a data line in the display area on the second surface of the base substrate after forming a conductive structure in a through hole corresponding to the data line;
   forming an insulating layer on a film layer on which the data line is located; wherein the second surface is closer to the insulating layer than the first surface;
   wherein forming a first-kind signal line electrically connected to the bonding electrode in the display area on the second surface of the base substrate in response to that the first-kind signal line further comprises a scanning line, comprises:
forming a through hole corresponding to the scanning line and passing through the base substrate and the insulating layer in the second surface of the base substrate, and forming a scanning line in the display area on the second surface of the base substrate after forming a conductive structure in the through hole;
wherein the method further comprises:
forming a connecting electrode located on the first surface of the base substrate and electrically connected to the drive circuit; wherein the connecting electrode comprises a first connecting electrode and a second connecting electrode;
the bonding electrode comprises a data line bonding electrode and a scanning line boding electrode, and the first connecting electrode is electrically connected to a source of a thin film transistor in the drive circuit, and the second connecting electrode is electrically connected to a gate of the thin film transistor in the drive circuit;
wherein the data line is located on one of top and bottom sides of the insulating layer, and the scanning line is located on other one of the top and the bottom sides of the insulating layer.

7. The method according to claim 6, wherein the forming a through hole at least passing through the base substrate in the second surface of the base substrate comprises:
forming a patterned hard mask layer on the second surface of the base substrate;
dry etching the base substrate by adopting the patterned hard mask layer as a shield to form the through hole; and
removing the hard mask layer.

8. The method according to claim 6, wherein the forming a conductive structure in the through hole comprises:
forming a seed layer on a bottom and wall surface of the through hole; and
filling the through hole with metal by using an electroplating process to form the conductive structure.

9. The method according to claim 8, wherein the seed layer is made of a metal element of titanium, molybdenum, tantalum, aluminum, copper or silver, or the seed layer is made of molybdenum alloy, copper alloy or aluminum alloy.

10. A method for manufacturing a display substrate, comprising:
forming a sacrificial buffer layer on a rigid substrate;
forming a bonding electrode at a side facing away from the rigid substrate, of the sacrificial buffer layer;
forming a base substrate at a side, facing away from the sacrificial buffer layer, of the bonding electrode; the base substrate comprising a first surface and a second surface arranged oppositely
forming a through hole passing through the base substrate, and forming a conductive structure in the through hole;
forming a drive circuit arranged in an array on the base substrate;
forming a signal line in the display area, wherein one end of the signal line is electrically connected to the bonding electrode, the other end of the signal line is electrically connected to the drive circuit, and the conductive structure is configured to connect the signal line, the drive circuit and the bonding electrode; and
removing the rigid substrate and the sacrificial buffer layer;
wherein the forming a signal line in the display area, comprises:
forming a first-kind signal line electrically connected to the bonding electrode in the display area on the second surface of the base substrate after forming the conductive structure in the through hole;
wherein forming a first-kind signal line electrically connected to the bonding electrode in the display area on the second surface of the base substrate in response to that the first-kind signal line comprises a data line, comprises:
forming a data line in the display area on the second surface of the base substrate after forming the conductive structure in a through hole corresponding to the data line;
forming an insulating layer on a film layer on which the data line is located; wherein the second surface is closer to the insulating layer than the first surface;
wherein forming a first-kind signal line electrically connected to the bonding electrode in the display area on the second surface of the base substrate in response to that the first-kind signal line further comprises a scanning line, comprises:
forming a through hole corresponding to the scanning line and passing through the base substrate and the insulating layer in the second surface of the base substrate, and forming a scanning line in the display area on the second surface of the base substrate after forming a conductive structure in the through hole;
wherein the method further comprises:
forming a connecting electrode located on the first surface of the base substrate and electrically connected to the drive circuit; wherein the connecting electrode comprises a first connecting electrode and a second connecting electrode;
the bonding electrode comprises a data line bonding electrode and a scanning line boding electrode, and the first connecting electrode is electrically connected to a source of a thin film transistor in the drive circuit, and the second connecting electrode is electrically connected to a gate of the thin film transistor in the drive circuit;
wherein the data line is located on one of top and bottom sides of the insulating layer, and the scanning line is located on other one of the top and the bottom sides of the insulating layer.

11. A display panel, comprising the display substrate according to claim 1 and a drive circuit connected to at least part of a bonding electrode.

12. A display device, comprising the display panel according to claim 11.

13. The display substrate according to claim 1, wherein the data line is located between the base substrate and the insulating layer, and the scanning line is located on a side facing away from the base substrate, of the insulating layer.

14. The display substrate according to claim 1, wherein the first connecting electrode is an extending part of the source, or the first connecting electrode and the source are in a same layer.

15. The display substrate according to claim 14, wherein the second connecting electrode is an extending part of the gate, or the second connecting electrode and the gate are in a same layer.

16. The display substrate according to claim 1, wherein the top side of the insulating layer is a side of the insulating layer facing the second surface of the base substrate, the bottom side of the insulating layer is a side of the insulating layer facing away from the second surface of the base substrate.

\* \* \* \* \*